US010700557B2

(12) United States Patent
Barukh (10) Patent No.: US 10,700,557 B2
(45) Date of Patent: Jun. 30, 2020

(54) MULTIBAND ENERGY HARVESTING (71) Applicant: W.P. ENERGY (S.B.) LTD., Ashdod (IL)

(72) Inventor: Shlomo Barukh, Ashdod (IL)

(73) Assignee: W.P. ENERGY (S.B. ) LTD., Ashdod (IL)

( * ) Notice: Subject to any disclaimer, the term of this patent is extended or adjusted under 35 U.S.C. 154(b) by 6 days.

(21) Appl. No.: 16/310,523

(22) PCT Filed: May 29, 2017

(86) PCT No.: PCT/IL2017/050595
§ 371 (c)(1),
(2) Date: Dec. 17, 2018

(87) PCT Pub. No.: WO2017/208231
PCT Pub. Date: Dec. 7, 2017

(65) Prior Publication Data
US 2019/0148985 A1 May 16, 2019

(30) Foreign Application Priority Data

Jun. 2, 2016 (IL) .......................................... 246003

(51) Int. Cl.
*H01Q 1/24* (2006.01)
*H01Q 9/04* (2006.01)
(Continued)

(52) U.S. Cl.
CPC ............ *H02J 50/27* (2016.02); *H01Q 1/243* (2013.01); *H01Q 1/248* (2013.01); *H01Q 1/38* (2013.01);
(Continued)

(58) Field of Classification Search
CPC .. H02J 50/27; H02J 50/12; H02J 7/025; H02J 7/02; H01Q 1/243; H01Q 1/248;
(Continued)

(56) References Cited

U.S. PATENT DOCUMENTS

2006/0164866 A1 7/2006 Vanderelli et al.
2012/0206096 A1 8/2012 John
(Continued)

FOREIGN PATENT DOCUMENTS

CN 103545858 A 1/2014
WO 2016071905 A1 5/2016

OTHER PUBLICATIONS

International Search Report dated Sep. 6, 2017 for PCT/IL2017/050595 filed May 29, 2017.
(Continued)

*Primary Examiner* — Robert L Deberadinis
(74) *Attorney, Agent, or Firm* — Paul D. Bianco; Gary S. Winer; Fleit Intellectual Property Law (57) ABSTRACT

Ambient RF EM energy harvesting generator and a corresponding method, including an antenna arrangement that receives and yields RF output, rectified by an RF to DC rectifier into DC output. The RF EM antenna arrangement includes at least one antenna module having an antenna triplet configured to absorb ambient RF radiation in first, second and third frequency ranges, respectively, and coupled with a compatible LC circuitry. The lowest frequency range is absorbed by an oscillation evoking antenna which induces oscillations between the other two antennas of the triplet. The rectifier includes, in addition to rectification circuitry, a capacitance matrix featuring an array of high frequency, high voltage, low-impedance, micro-capacitors, mounted in parallel and series, which is operative for transiently accumulating the rectified DC output of the rectification circuitry.

20 Claims, 7 Drawing Sheets

(51) Int. Cl.
*H02J 50/27* (2016.01)
*H02J 50/12* (2016.01)
*H01Q 1/38* (2006.01)
*H01Q 19/30* (2006.01)
*H02M 7/06* (2006.01)
*H02J 7/02* (2016.01)
*H05K 1/02* (2006.01)

(52) U.S. Cl.
CPC ........... *H01Q 9/0421* (2013.01); *H01Q 19/30* (2013.01); *H02J 50/12* (2016.02); *H02M 7/06* (2013.01); *H02J 7/025* (2013.01); *H05K 1/025* (2013.01)

(58) Field of Classification Search
CPC ........ H01Q 1/38; H01Q 9/0421; H01Q 19/30; H01Q 1/24; H01Q 9/04; H02M 7/06; H05K 1/025; H05K 1/02
See application file for complete search history.

(56) References Cited

U.S. PATENT DOCUMENTS

| | | |
|---|---|---|
| 2012/0256492 A1 | 10/2012 | Song et al. |
| 2016/0020636 A1 | 1/2016 | Khlat |
| 2016/0071905 A1 | 3/2016 | Park |
| 2016/0149441 A1 | 5/2016 | Nayak |

OTHER PUBLICATIONS

International Preliminary Report dated Dec. 4, 2018 with Written Opinion for PCT/IL2017/050595 filed May 29, 2017.

MULTIBAND ENERGY HARVESTING

FIELD OF THE INVENTION

The present invention relates generally to energy harvesting, and to ambient radio frequency electromagnetic radiation harvesting in particular.

BACKGROUND OF THE INVENTION

Mobile devices, including smart phones, by their very nature require the ability to operate without being wired to an external power supply. To satisfy this requirement, mobile devices typically are powered by rechargeable batteries. Unfortunately, the rechargeable batteries installed in mobile devices are conventionally configured such that those mobile devices must periodically engage with a wired power supply in order to recharge their batteries, and thereby becoming "non-mobile" while recharging or require manual battery replacement.

In addition, many standard devices, such as smoke or gas detectors, within houses and commercial buildings require continuous maintenance because of their dependence on battery power. This can be quite laborious and in some cases detrimental to health and safety when batteries are not changed on time. Some new buildings have these wired into the internal electoral circuits, but this can be quite expensive to retrofit to an old building. A way to keep these devices automatically powered or charged would keep people much safer, saving lives in the case of emergencies.

Because of the increased use of mobile devices such as mobile phones, televisions and Wi-Fi networks, radio frequency (RF) waves are common all over the world, especially inside of buildings. While technology to convert RF waves into usable power exists, it is not efficient or strong enough to use the power harnessed in any commercial setting.

Currently available wireless recharging solutions depend on close proximity and/or precise placement of the device to be recharged and utilize mains power or another power source as a source of energy. Because of the availability of RF waves in modern society, a new RF harnessing technology has the potential to transform the way small and mobile devices are powered.

*A Power-Efficient Radio Frequency Energy-Harvesting Circuit* by Philip Khoury discloses a thesis exploring radio frequency (RF) energy harvesting, specifically on the design of a rectenna circuit. The thesis investigates an ideal antenna design, focusing on a Koch fractal loop antenna to increase overall efficiency in low level power conversions. Former works are consulted as the author finds an ideal design consisting of a seven-element Greinacher rectifier and several multi-pronged, multi-frequency Koch loop and meandered open stub antennas. This final design was simulated with a software package over a variety of radio frequencies.

*RF Energy Harvesting for the Low Energy Internet of Things* a publication by Drayson Technologies describing a high efficiency, radio frequency energy-harvesting system. It discusses a standard harvester for collecting and converting ambient radio frequency to power low energy devices. This harvester generally consists of an antenna, an impedance matching network, a non-linear component and an RF filter and power management module. The antenna may vary for application of different ranges of wavelengths but the antenna is configured for one specific range of wavelengths.

*Ambient Electromagnetic Wireless Energy Harvesting using Multiband Planar Antenna* a publication by Nimo et al. discusses an approach to electromagnetic energy gathering using planar antennas. A simple circuit is discussed to convert the signal from the antenna to DC power. The general aim of the thesis is to optimize an antenna implemented to maximize efficiency of energy collection from an ambient electromagnetic concentration. This publication discloses that using a multiband/broadband harvesting will improve the efficiency of an electromagnetic harvester of RF waves.

*Design Optimization and Implementation for RF Energy Harvesting Circuits* by Ufuk Muncuk discusses a variety of configurations to maximize RF energy harvesting. Specifically, it optimizes the number of rectifier stages for the efficiency of energy harvesting as well a simulation of several sub-circuit stage arrangements as well as simulates the difference of different types and amount of antennas used. Overall, Muncuk optimizes an RF energy harvesting circuit by changing the number rectifier stages as well as different types and amounts of antennas, optimizing current technologies through computer simulation.

SUMMARY OF THE INVENTION

In accordance with the disclosed invention there is provided an ambient radio frequency (RF) electromagnetic (EM) energy harvesting generator and system and a corresponding method for operating the harvesting generator and system. The generator includes an antenna arrangement that yields RF output, rectified by an RF to DC rectifier into DC output. The RF EM antenna arrangement includes an antenna triplet coupled with a compatible LC circuitry, including an inductor, capacitor, and configured to absorb ambient RF radiation in a first, second and third frequency ranges, respectively. The lowest frequency range is absorbed by an oscillation evoking antenna which induces oscillations between the other two antennas of the triplet. The rectifier includes in addition to rectification circuitry, a capacitance matrix featuring an array of high frequency, high voltage, low-impedance, micro-capacitors, mounted in parallel and series and operative for transiently accumulating the rectified DC output of the rectification circuitry.

In accordance with one aspect of the invention, there is thus provided an ambient RF EM energy harvesting generator, which includes an antenna arrangement for receiving RF EM radiation and providing an RF output. The antenna arrangement includes at least one antenna module configured to absorb ambient EM radiation for producing the RF output. The generator further includes an RF to DC rectifier connected to the antenna arrangement for receiving the RF output and providing a rectified DC output. The rectifier includes rectification circuitry for converting the RF output into an unstable rectified DC output, and a capacitance matrix for accumulating the charge received as an unstable rectified DC output. The capacitance matrix includes an array of high frequency, high voltage, low-impedance, micro-capacitors mounted in parallel for transiently accumulating the charge received as the unstable rectified DC output of the rectification circuitry, and allowing release of the charge as a non-regulated rectified DC output.

In accordance with another aspect of the invention, there is thus provided an ambient RF EM energy harvesting generator, which includes an antenna arrangement for receiving RF EM radiation and providing an RF output, and an RF to DC rectifier for receiving the RF output and providing a rectified DC output. The antenna arrangement includes at least one antenna module configured to absorb ambient EM radiation for producing the RF output, wherein the RF EM antenna module includes, an antenna triplet and compatible LC Circuitry. The antenna triplet includes an upper frequency range (UFR) antenna configured to absorb ambient RF radiation in a first frequency range, e.g., in the UFR of 1 GHz to 6 GHz. The first frequency range may extend from 2 GHz, or to 4 GHz. The antenna module further includes a lower frequency range (LFR) antenna configured to absorb ambient RF radiation in a second frequency range below the first frequency range, e.g., in the LFR of 40 MHz to 3 GHz. The second frequency range may extend from 800 MHz, or to 2 GHz, or to 1 GHz. The antenna triplet further includes an oscillation evoking antenna for inducing oscillations between the UFR antenna and the LFR antenna, the oscillation evoking antenna being configured to absorb ambient RF radiation in a third frequency range below the second frequency range, ranging fully or partially above 50 Hz, e.g., in the VLF range of 1.5 MHz to 1.5 GHz. The third frequency range may extend from 27 MHz, or to 1 GHz. The antenna module further includes LC circuitry including an inductor and a capacitor (LC) network responsive to resonances in the first, second and third frequency ranges, respectively, and in which the UFR antenna, LFR antenna, and oscillation evoking antenna are connected, such that RF energy in the first, second and third frequency ranges is absorbed by the LC circuitry. The antenna arrangement may further comprise an amplifier connected at the output to said antenna module for amplifying said RF output, and providing an amplified RF output. The first, second and/or third antenna may be a Yagi-Uda ("Yagi") like antenna with director dipole elements. The antennas may additionally be folded or wound.

In accordance with a further aspect of the invention, there is thus provided an ambient RF EM energy harvesting system which includes, in addition to the ambient RF EM energy harvesting generator at least one of: a voltage stabilizer coupled with the rectifier for regulating the non-regulated rectified DC output into regulated DC output, an electric charge internal storage for storing the charge provided by the generator for feeding components of the generator, and for charging an external host storage, a voltage multiplier for providing an adequate voltage of the DC output, and a controller for managing and controlling the RF EM harvesting, the charging of an internal storage, the charging of an external host storage, the feeding of components of the system, and the feeding of an external power source.

In accordance with a further aspect of the invention, there is thus provided a method for harvesting ambient RF EM energy including the procedures of absorbing ambient EM radiation by at least one antenna arrangement that provides an RF output, and rectifying the RF output into a non-regulated DC output by an RF to DC rectifier. The rectifying includes converting the RF output into an unstable rectified DC output by a rectification circuitry; and may further include transiently accumulating, by a capacitance matrix including an array of high frequency, high voltage, low-impedance micro-capacitors mounted in parallel, the charge received as the unstable rectified DC output from the rectification circuitry, to provide a non-regulated rectified DC output. The absorbing of ambient EM radiation by at least one antenna arrangement may include absorbing an UFR of RF EM energy by an antenna configured to absorb ambient RF radiation in a first frequency range, e.g., in the MF range of 1 GHz to 4 GHz, absorbing a lower frequency range (LFR) of RF EM energy by an antenna configured to absorb ambient RF radiation in a second frequency range below the first frequency range, e.g., in the LF range of 40 MHz to 1 GHz, inducing oscillations between the MFR antenna and the LFR antenna by an oscillation evoking antenna configured to absorb ambient RF radiation in a third frequency range below the second frequency range, ranging fully or partially above 50 Hz, e.g., in the VLF range of 1500 kHz to 50 MHz, and coupling the MFR antenna, the LFR antenna, and the oscillation evoking antenna with an LC circuitry including an inductor capacitor (LC) network responsive to resonances in the first, second and third frequency ranges, such that RF energy in the first, second and third frequency ranges is absorbed by the LC circuitry to provide the RF output.

BRIEF DESCRIPTION OF THE DRAWINGS

Embodiments of the invention are described with reference to the accompanying drawings. In the drawings, like reference numbers indicate identical or functionally similar elements. Additionally, the left most digit(s) of a reference number identifies the drawing in which the reference number first appears.

DETAILED DESCRIPTION OF THE EMBODIMENTS

Embodiments of the present invention utilize acquired local ambient energy (EM harvesting) for transduction into electrical energy. The invention enables electromagnetic harvesting devices to recharge their own batteries as well as batteries of a host device, such as a mobile or unwired device, without being wired to an external power supply. The harvesting device may be disposed in a mobile energy-consuming host device including a harvesting circuit to power the host device, forming a self-powered wireless device.

In its broadest aspects, the disclosed invention features an ambient radio frequency (RF) electromagnetic (EM) energy harvesting generator, system and method, for harvesting energy in the RF range, including, inter alia, the microwave ranges. The generator includes an antenna arrangement for receiving RF EM radiation and providing an RF output, and includes at least one antenna module configured to absorb ambient EM radiation for producing the RF output. The generator further includes an RF to DC rectifier connected to the antenna arrangement for receiving the RF output and providing a rectified DC output.

In accordance with one novel aspect of the invention the rectifier includes a rectification circuitry for converting the RF output into a non-regulated DC output, and a capacitance matrix. The capacitance matrix is able to receive and store low currents at highly varying, non-linear voltages (varying at high and unordered "frequencies") and provide a stable, non-regulated DC output which can be regulated by a standard DC regulator. The capacitance matrix features an array of high frequency, high voltage, low-impedance micro-capacitors, mounted in parallel for transiently accumulating in series the charge received as the non-regulated DC output of the rectification circuitry. The capacitors are sequentially charged in series and are discharged simultaneously as a non-regulated DC current and provide a non-regulated rectified DC output.

It will be appreciated that all terms related to electronic components, such as 'capacitor,' 'inductor,' 'resistor,' 'diode,' 'antenna,' etc., denote the functional operation thereof and are not limited to such simple elements, and may be implemented by all equivalent structures, including compound structures and combinations, that provide an equivalent (or improved) performance and operation.

In accordance with another novel aspect of the invention the antenna module includes three antennas arranged with inductor capacitor (LC) circuitry. The antenna triplet includes first, second and third antennas. The first antenna is an upper frequency range (UFR) antenna configured to absorb ambient RF radiation in a first frequency range, e.g., primarily in the medium frequency (MF) range of 1 GHz to 6 GHz. The first a frequency range may extend from 2 GHz, or to 4 GHz. The second antenna is a lower frequency range (LFR) antenna, configured to absorb ambient RF radiation in a second frequency range below the first frequency range, e.g., primarily in the LF range of 40 MHz to 3 GHz. The second frequency range may extend from 800 MHz, or to 2 GHz, or to 1 GHz. The third antenna is an oscillation evoking antenna for inducing oscillations between the UFR antenna and the LFR antenna. The oscillation evoking antenna is configured to absorb ambient RF radiation in a third frequency range below the second frequency range, ranging fully or partially above 50 Hz, e.g., in the very low frequency (VLF) range of 1.5 MHz to-1.5 GHz. The third frequency range may extend from 27 MHz, or to 1 GHz. It will be appreciated that any antenna of the triplet antennas may be implemented by a compound assembly or an array of antennas that functions as an 'antenna' and provides equivalent or improved functionality, performance and operation. It will be further appreciated that the terminology "upper frequency," "medium frequency," "lower frequency," and "very low frequency," are used as relative nomenclature but are not meant to be limiting in detonating a specific frequency other than when defined.

The LC circuitry includes an LC network responsive to resonances in the first, second and third frequency ranges, in which the UFR antenna, LFR antenna, and oscillation evoking antenna are connected, such that RF energy in the first, second and third frequency ranges is absorbed by the LC circuitry. The spontaneously resonating oscillations induced by the oscillation evoking antenna "refresh" the current in the circuitry and prevent saturation of the LC circuitry by the RF energy absorbed by the UFR and LFR antennas and therefore the antenna module operates as a spontaneous RF energy pump that perpetually and relentlessly harvests ambient energy (some of the energy harvested is dissipated as heat), without requiring further energy sources for yielding RF output (except amplification—as described herein below, which is required for meeting standards of contemporary electronic components processing the harvested energy). The RF output is continuously fed, via the rectification circuitry, to the array of micro-capacitors of the capacitance matrix, whose micro-capacitance while connected in parallel provides a highly responsive mechanism for effectively receiving and storing the small currents with rapidly changing chaotic voltages. The micro-capacitors are configured to contain virtually all of the "working" frequencies reaching the micro-capacitors. Typically, the micro capacitors are sequentially charged in series and are discharged simultaneously.

Figure 1:
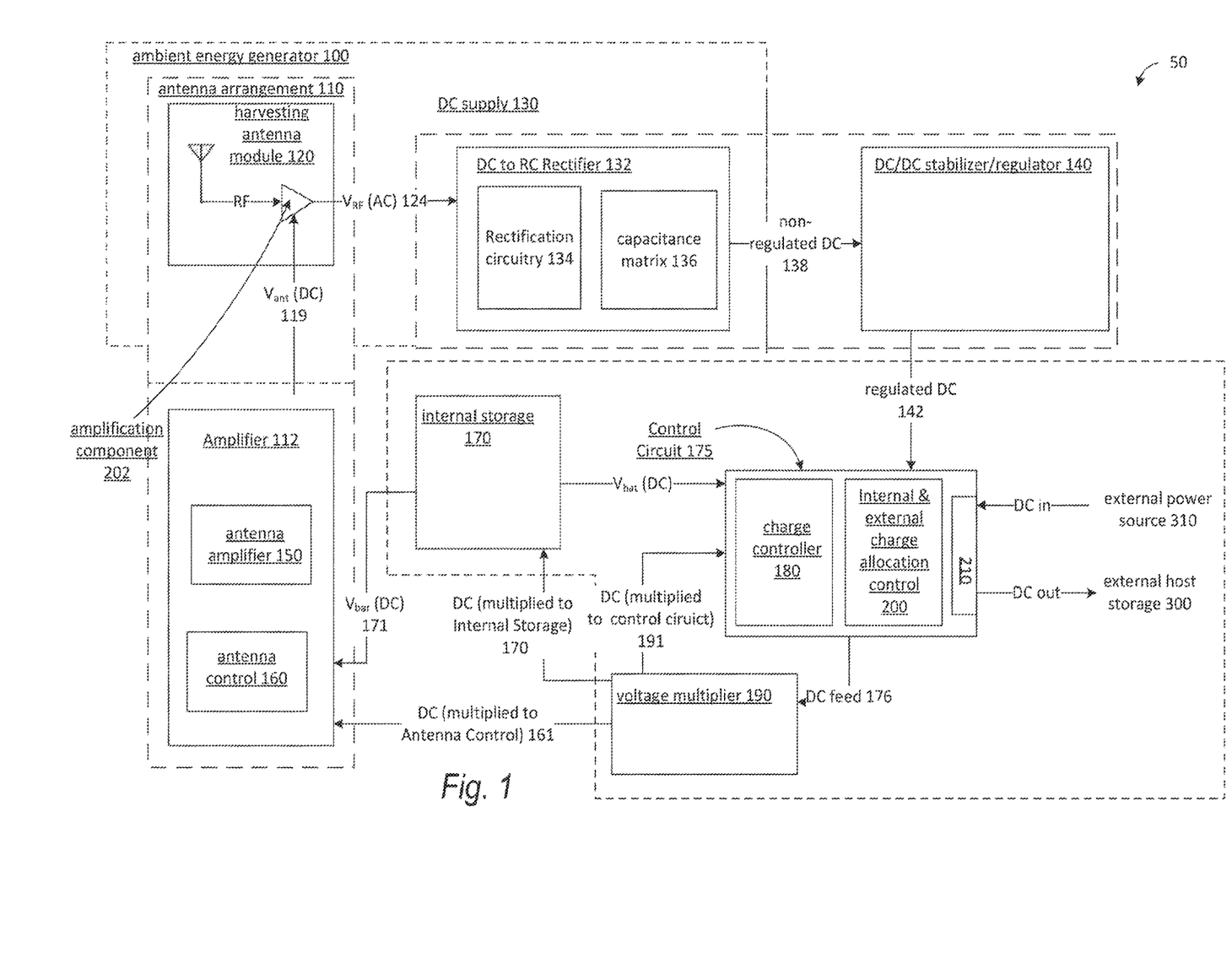
FIG. 1 is a block diagram of an embodiment of an ambient radio frequency (RF) electromagnetic (EM) energy harvesting system, constructed and operative in accordance with the disclosed invention.

Reference is now made to the Figures herein, in which like numbers denote like parts. Reference is now made to FIG. 1, which is a block diagram of an embodiment of an ambient RF EM energy harvesting system, generally referenced 50, constructed and operative in accordance with the disclosed invention. Energy harvesting system 50 includes harvesting antenna module 120, current amplifier 112, RF to DC rectifier 132, and DC stabilizer 140. Amplifier 112 selects a power source from a plurality of power sources ensuring the output of a selected constant voltage, $V_{ant}$ 152. $V_{ant}$ 152 is provided to harvesting module 120 in order to amplify the harvested ambient RF energy. Amplifier 112 comprises antenna control 160 and antenna amplifier 150. Amplifier 112 is designed to accept a current (e.g., DC 161) and selectively provide an amplified output, $V_{ant}$. Antenna control 160 ensures a proper voltage is available and chosen from a multitude of voltage sources. Antenna amplifier 150 ensures that a proper voltage is provided, e.g., $V_{ant}$ may be 3.3V. Harvesting module 120 has a plurality of antennas that absorb ambient RF radiation from a multiplicity of frequency ranges. An amplification component 202 combines the harvested ambient RF radiation with $V_{ant}$ 152. Harvesting module 120 provides an amplified RF AC output 124, $V_{RF}$.

RF to DC rectifier 132 converts amplified RF AC output 124 into a non-regulated DC output 138. RF to DC rectifier 132 includes a rectification circuitry 134 and a capacitance matrix 136. Rectification circuitry 134 converts AC to DC. Capacitance matrix 136 includes an array of micro-capacitors for transiently accumulating charge to provide a non-regulated DC output 138. DC stabilizer 140 regulates non-regulated DC to DC with a constant voltage. Specifically, DC stabilizer 140 regulates non-regulated DC 138 to a regulated DC 142.

Remaining elements in RF EM energy harvesting system 50 include internal a control circuit 175, internal storage 170, voltage multiplier 190, with external host storage 300, and external power source 310. Control circuit 175 is a configurable assembly able to direct a plurality of currents, such as regulated DC 142, to a plurality of other assemblies or devices depending on predetermined conditions. Control circuit 175 features charge controller 180, and internal and external charge allocation control 200. Charge controller 180 manages and controls the RF EM harvesting, storage, charging and consumption. External charge allocation control 200 connects external host storage 300 and power source 310 through interface 210.

Voltage multiplier 190 multiplies a voltage input, such as DC feed 176 from control circuitry 175 to produce multiplied DC currents 191, 192, and 193. Voltage multiplier 190 provides DC current 191 to amplifier 112, which in turn provides $V_{ant}$ 119 to harvesting antenna module 120. Voltage multiplier 190 may also provide DC current 192 to internal storage 170. Internal storage 170 stores DC current 192 to be used by amplifier 112 when its operation is called for. Voltage multiplier 190 finally may provide DC current 193 to control circuitry 175.

Controls 180 and 200 are connected to internal storage 170, voltage multiplier 190, and interface 210. Controls 180 and 200 are fed by at least one of several sources: regulator 140 with regulated DC 142, by internal storage 170 with $V_{bat}$, and by an external power source 310 with a DC supply. Control circuit 175 feed DC received from any of the sources (e.g., regulated DC 142, DC from external power source 310, and DC $V_{bat}$ from internal storage 170), back to internal storage 170, to antenna control 160, and to external host storage 300 (through interface 210), either directly, or via voltage multiplier 190. Voltage multiplier 190 is used when voltage multiplication is required. It is noted that controls 180, 200 optionally maintain internal storage 170 at a minimum charged level (e.g., battery being substantially full) before any feeding of DC output to external host storage 300 (e.g., the battery of the mobile device to be served by system 50). Accordingly, when internal storage 170 is not at the minimum charged level (as predetermined for satisfying performance requirements), the DC received from the available power sources (external power source 310 or ambient energy generator 100) is initially supplied to internal storage 170 until reaching a minimum charged level. Controller 160 connects to antenna arrangement 110, rectifier 132, and possibly internal storage 170, for managing and controlling the RF EM harvesting, the charging of an internal storage, the charging of an external host storage, the feeding of components such as harvesting antenna module 120, RF to DC rectifier 132, and control circuitry 175, and the feeding of external power source 310 to any component of the RF EM harvesting system when such a source is plugged into the RF EM energy harvesting system.

Controller 160 connects the energy processing components to harvesting antenna module 120. Controller 160 connects to harvesting antenna module 120, RF to DC rectifier 132, and possibly to internal storage 170. Controller 160 manages and controls the RF EM harvesting, the charging of internal storage 170, the charging of external host storage 300, the feeding of components such as harvesting antenna module 120, RF to DC rectifier 132 and control circuitry 175, and the feeding of external power source 310 to any component of the RF EM harvesting system when such a source is plugged into the RF EM energy harvesting system.

Energy harvesting system 50 includes three partially overlapping functional sections, denoted by dashed lines, which share components: ambient energy generator 100, antenna arrangement 110 and DC supply 130. Ambient energy generator 100 converts harvested RF energy from harvesting antenna module 120 to non-regulated DC 138. Ambient energy generator 100 includes harvesting antenna module 120 and RF to DC rectifier 132. RF to DC rectifier 132 is connected to, and feeds the non-regulated DC to DC regulator 140, which regulates the DC and feeds it to control circuit 175. Antenna arrangement 110 includes harvesting antenna module 120, and amplifier 112. DC supply 130 includes RF to DC rectifier 132, and DC stabilizer 140.

It will be noted that the RF amplification is optional and is implemented to fit requirements of electronic components typically used in DC supply 130 (e.g., requiring minimal voltage). Accordingly, amplifier 112 may be omitted and antenna arrangement 110 may feed its harvested RF directly without amplification and without requiring DC feed.

It will be noted that stabilization or regulation of non-regulated DC 138 output of rectifier 132, is a matter of preference required to meet the standards of further electronic components, and that in some embodiments regulator 140 may be omitted, wherein the non-regulated DC 138 output of rectifier 132 is fed directly to controls 180, 200 and to the other components of system 50.

Figure 2:
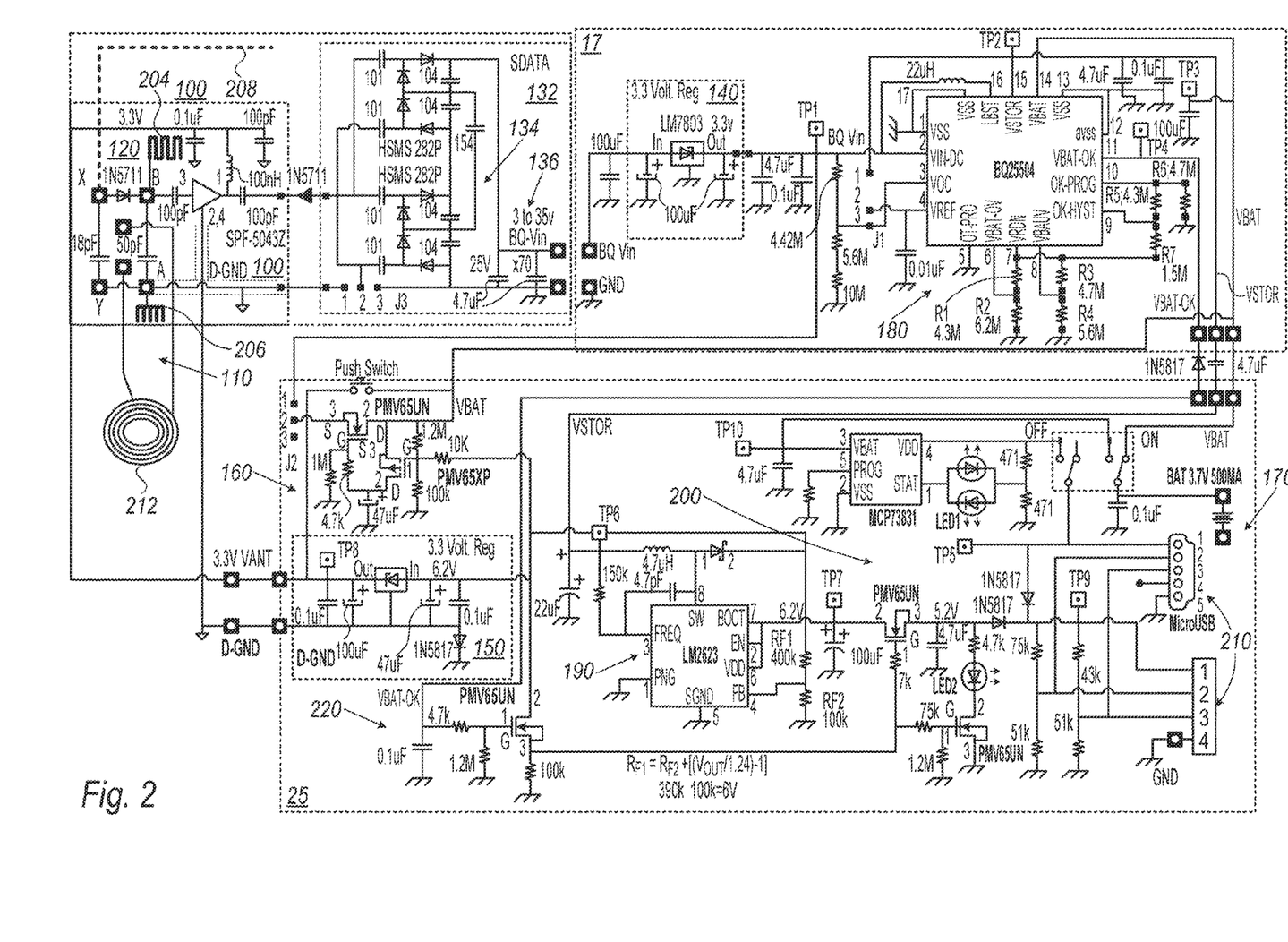
FIG. 2 is a circuit schematic of the embodiment of FIG. 1.

Reference is additionally made to FIG. 2, which is a circuit schematic of the embodiment of FIG. 1. The circuit schematic expands on the block diagram of an embodiment of an ambient RF EM energy harvesting system 50 (FIG. 1) with exemplary devices and instruments. The devices and instruments, as shown in FIG. 1, are denoted by dashed lines.

DC regulator 140 regulates non-regulated DC 138 to a regulated DC 142 at a constant voltage (e.g., 3.3 V). Voltage stabilizer 140 is coupled with rectifier 132, which provides a non-regulated DC 138. Electric charge internal storage 170 (battery) is coupled with stabilizer 140 and antenna arrangement 110 for storing the charge provided by multiplied DC 192 of voltage multiplier 190, and for providing a DC feed e.g., 3.3 V to 3.7 V, for feeding the active antenna module, or its RF amplifier and other component of the system, and for charging an external host storage, e.g., cell phone battery in a host device incorporating the charger, or a client storage disposed completely externally to the charger location. Voltage multiplier 190 provides an adequate voltage of the DC output to an external host (e.g., 6.2 V).

Ambient RF EM energy harvesting generator 100 may include an amplifier 112 which includes an antenna amplifier 150 and antenna control 160. Antenna amplifier 150 amplifies the RF output by a gain factor of 50 dB for providing the amplified DC output. Antenna amplification control 160 is configured to allocate a power source to antenna module 120 in a hierarchy including an external charge source, than the rectified DC output of the rectifier, and lastly, the DC current feed of an internal storage. When external power source 310 is plugged into the ambient RF EM energy harvesting generator 100, external power source 310 provides the additional amplification power. When internal storage 170 is charged below a predetermined threshold, rectified DC output of the RF to DC rectifier 132 provides the additional amplification power. When internal storage 170 is charged above a predetermined threshold the DC current feed, $V_{bat}$ 171, of the internal storage provides the additional amplification power. Optionally, charge controller 180 is operative for allocating a power source to external host storage 300 and the components of EM energy harvesting system 50 in a hierarchy including: external charge source 310, than rectified DC output of RF to DC rectifier 132, and lastly, DC current feed of an internal storage 170. As long as external host storage 300 and internal storage 170 are not full, an external charge source is plugged into EM energy harvesting system 50 feeding all components of the EM energy harvesting charger, including internal storage 170.

Figure 3:
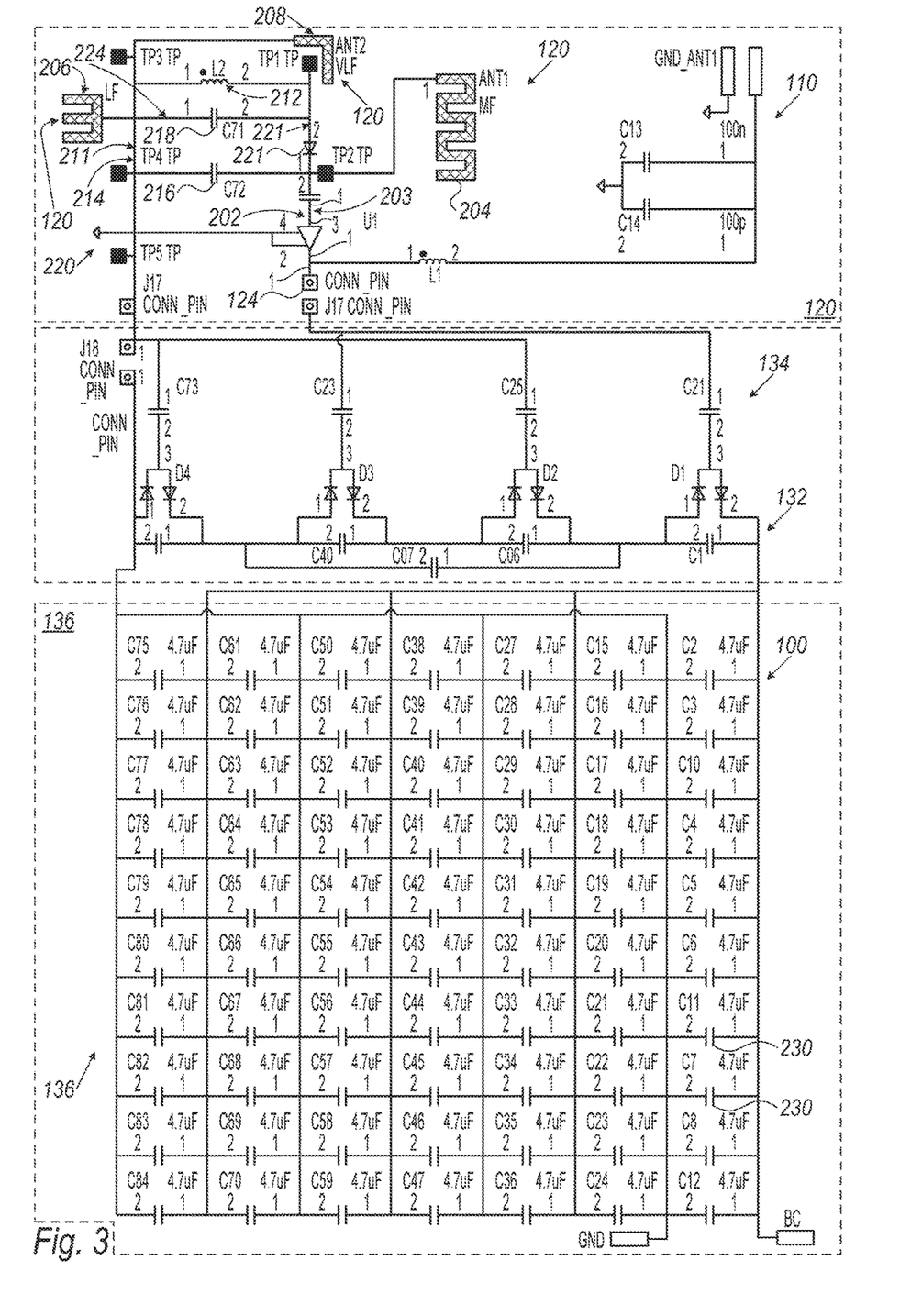
FIG. 3 is circuit schematic of ambient energy generator constructed and operative in accordance with the disclosed invention.

Reference is now made to FIG. 3 as well, which is a circuit schematic of ambient energy generator 100 (FIG. 1), constructed and operative in accordance with the disclosed invention. Ambient energy generator 100 includes harvesting antenna module 120, rectification circuitry 134, and capacitance matrix 136. Harvesting antenna module 120 harvests ambient RF energy and provides an RF AC output 124. Harvesting antenna module 120 includes an antenna triplet with upper frequency range (UFR) antenna 204, a lower frequency range (LFR) antenna 206, an oscillation evoking antenna 208, and an amplification component 202. The antenna triplet has adequate circuitry for efficiently absorbing ambient RF energy which is abundant in particular frequency ranges. It will be noted that more or less ambient antenna modules 120 can be mounted together to multiply the harvesting capacity of ambient energy generator 100, depending on the harvesting needs and the space available for containing the antenna modules.

UFR antenna 204 is configured to absorb ambient RF radiation in a first frequency range, optionally in the "upper frequency" (typically UF range of 1 GHz to 4 GHz, which may be extended from as low as 500 MHz, or 1 GHz, up to 6 GHz). LFR antenna 206 is configured to absorb ambient RF radiation in a second frequency range below the first frequency range in the "low frequency" LF range of 40 MHz to 1 GHz, or partially overlapping the upper frequency range, such as from as low as 40 MHz, or 800 MHz, up to 2 GHz, or to 3 GHz. Oscillation evoking antenna 208 induces oscillations between UFR antenna 204 and LFR antenna 206. Oscillation evoking antenna 208 is configured to absorb ambient RF radiation in a third frequency range, optionally below the second frequency range (may be partially overlapping), ranging fully or partially above 50 Hz, e.g., in the "very low frequency" (VLF) range of 1500 kHz to 1.5 GHz, (which may extend from 27 MHz up to 1 GHz or to 1.5 GHz).

Either UFR antenna 206 or LFR antenna 208 may include a plate of rectangular microstrip patch with cut out etched strips forming a crooked folded inverted conformed antenna (FICA) format, the dimensions of which are configured for disposing in a mobile cellular device. Either antenna may additionally include a plate rectangular with cut out etched strips forming a planar inverted 'F' antenna (PIFA) format, the dimensions of which are configured for disposing in a mobile cellular device; wherein The UFR and the LFR antennas, 206 and 208 respectfully, are disposed in parallel and are separated by a dielectric material. Oscillation evoking antenna 208 may include a wire, configured for disposing in a mobile cellular device.

The UFR antenna may be imprinted on one face of a double faced printed circuit board (PCB), and the LFR antenna may be imprinted on another face of the PCB. The PCB may include a two ply sandwiched dielectric substrate, wherein UFR antenna 206 and LFR antenna 208 are imprinted on external faces thereof and wherein further circuitry elements, including at least one coil, are imprinted on an internal face sandwiched between two plies of the dielectric substrate.

UFR antenna 206 may include an array of parallel flat stripes of 6 mm width and spaced apart by the cut out etched strips at 2.5 mm gaps, each adjacent two of the UFR stripes being perpendicularly connected at alternating ends thereof by a sheer UFR stripe of same width. LFR antenna 208 may include an array of parallel flat LFR stripes of 8.5 mm to 9 mm width and spaced apart by the cut out etched strips at 5 mm gaps, the stripes being perpendicularly connected at one end thereof by a sheer LFR stripe of same width.

Antenna module 120 further includes LC circuitry 211, suitable for receiving RF energy in the first, second and third frequency ranges. Typically, such circuitry includes an inductor capacitor (LC) network, such as network 211, which is responsive to resonances in the first, second and third frequency ranges, in which UFR antenna 204, LFR antenna 206, and oscillation evoking antenna 208 are connected, such that RF energy in the first, second and third frequency ranges is absorbed by LC circuitry.

LC network 211 includes further circuitry components such as inductor element 212 and dual capacitor arrangement 214. Capacitor arrangement 214 includes upper frequency range capacitor element 216 for inducing resonance in the first frequency range, and lower frequency range capacitor element 218 for inducing resonance in the second frequency range, wherein the combination of upper frequency range capacitor element 216 and lower frequency range capacitor element 218 is compatible for inducing resonance in the third frequency range. The inductor and capacitor elements 216 and 218 are connected in parallel. Diode element 221 separates one branch, i.e., branch 222, which connects two capacitor elements 216 and 218, wherein UFR antenna 204 and LFR antenna 206 are connected to a branch of the circuitry, i.e., branch 224, with one of the capacitor elements, i.e., capacitor element 216 (which could be interchanges with capacitor element 218), connected in between, and wherein oscillation evoking antenna 208 is connected to a branch connecting another of the capacitor elements (i.e., 218 or interchanged with 216) and inductor element 212. Inductor 212 may be a coil. It will be noted that instead of antennas 204 and 206, further similar antennas may be incorporated into module 120 for enhancing the absorbance of similar frequency ranges, or further non-similar antennas may be implemented into module 120 for adding absorbance of further frequency ranges. The addition of further antennas may be implemented with further circuitry elements (e.g., capacitors, inductors, resistors, diodes, other oscillation evoking antennas, etc.) in a more complex arrangement.

Antenna arrangement 110 further includes an amplifier (i.e., antenna amplifier 150, FIG. 1) connected at output 203 of antenna arrangement 110, by amplification component 202, to antenna module 120, for amplifying the RF output, for example with a gain factor of 50 dB, and provides amplified RF AC output 124. Amplified RF AC output 124 is received by RF to DC rectifier 132. The first stage of the RF to DC rectification is rectification circuitry 134. RF to DC rectifier 132 rectifies amplified RF AC output 124, fed by antenna module 120, into non-regulated DC 138. RF to DC rectifier 132 includes rectification circuitry 134 and a charge capacitance matrix 136. Rectification circuitry 134 converts amplified RF AC output 124, into non-regulated DC output. Rectification circuitry 134 can include, for example, an arrangement of diodes or thyristors as well as capacitors and further elements, such as used in a Graetz bridge rectifier, a full-wave rectifier, a half wave rectifier, and the like. Rectification circuitry 134 and capacitance matrix 136 convert amplified RF AC output 124 into non-regulated DC output 138. Rectification circuitry 134 includes an arrangement of diodes or thyristors as well as capacitors and further elements, such as used in a Graetz bridge rectifier, a full-wave rectifier, a half wave rectifier, and the like. The current from RF to DC rectifier 132 reaches capacitance matrix 136, which includes an array of high frequency, high voltage, low-impedance, micro-capacitors 230, mounted in parallel and series for transiently accumulating the charge received as the non-regulated DC output of rectification circuitry 134.

Capacitance matrix 136 includes an array of high frequency, high voltage, low-impedance, micro-capacitors 230, mounted in series-parallel arrays forming rectangular matrices for transiently accumulating charge received, as the non-regulated DC output 138, from rectification circuitry 134. Non-regulated DC output 138 typically fluctuates between 3 V to 35 V. Typically, a multiplicity capacitors which are mounted in parallel are sequentially charged in series, wherein the charging is almost instantaneous, and are discharged simultaneously, wherein the discharge is slow, as a non-regulated DC output (e.g., 5 V to 30 V), and thus provide a non-regulated rectified DC output. Micro-capacitors 230 can feature for example 70-100 capacitors with capacitance in the range of µF to microfarads (read µF as microfarad; 1 microfarad is 1 times 10 to the −6 power Farad, i.e., 0.1 µF to 10 µF), e.g., 2 µF to 7 µF, and particularly 4.7 µF. In addition to mounting an array of micro-capacitors in parallel (for reaching minimal or sufficient current intensity) further similar arrays of capacitors may be mounted in series (for increasing the output voltage).

Figure 4:
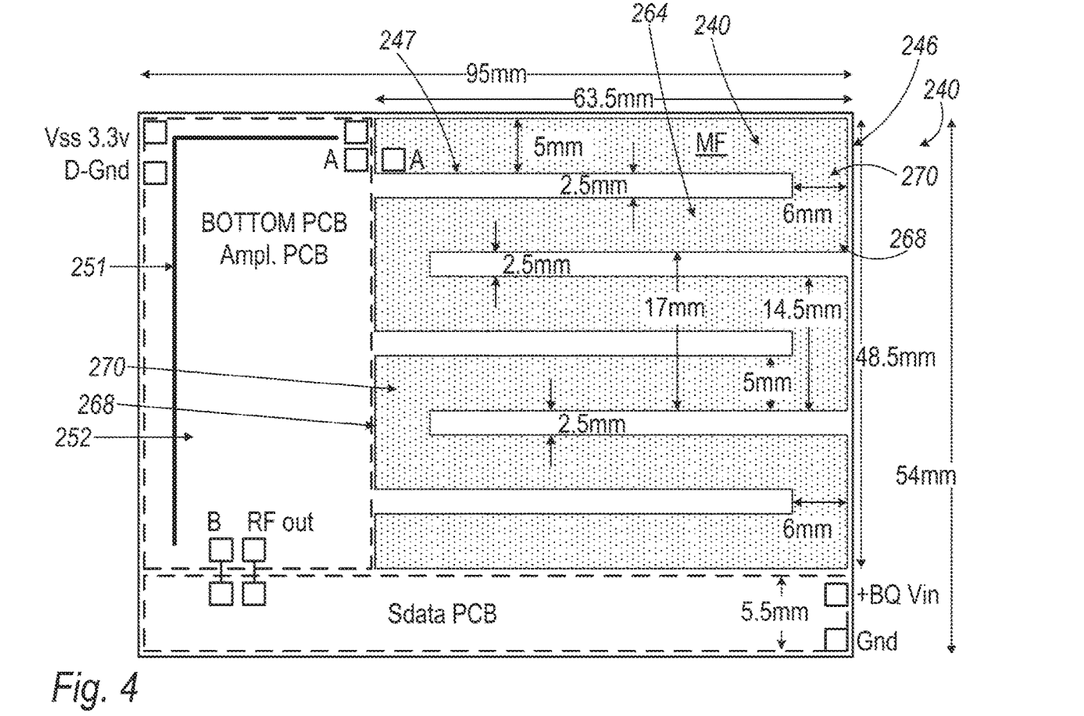
FIG. 4 illustrates a medium frequencies (MF) RF EM harvesting antenna, constructed and operative in accordance with the disclosed invention.
Figure 5:
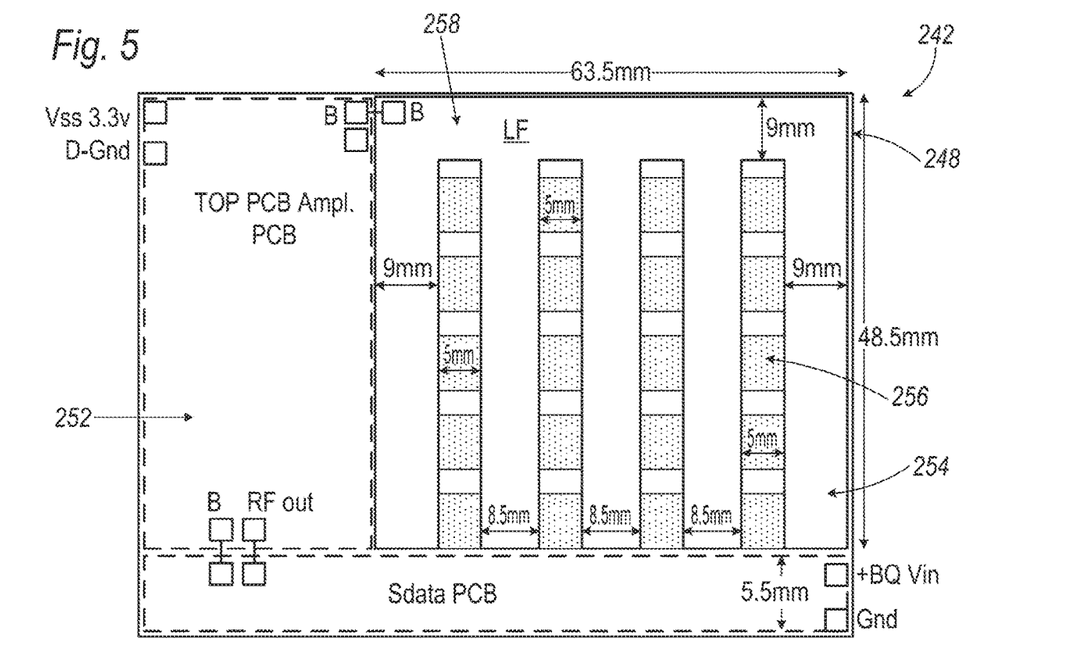
FIG. 5 illustrates a low frequencies (LF) RF EM harvesting antenna, constructed and operative in accordance with the disclosed invention.

The specific antennas are now discussed with reference to FIG. 4 and FIG. 5. FIG. 4 illustrates a medium frequencies (MF) RF EM harvesting antenna, constructed and operative in accordance with the disclosed invention. FIG. 5 illustrates a low frequencies (LF) RF EM harvesting antenna, constructed and operative in accordance with the disclosed invention. In a preferable embodiment, antenna module 120 further includes particular UFR antenna 240 and particular LFR 242, best seen in FIGS. 7 and 8. MFR antenna 240 includes a plate, optionally of silver plated copper, or of composite materials available on the market, such as "RT/Duroid® 5870/5880" (https://www.rogerscorp.com/documents/606/acm/RT-duroid-5870-5880-Data-Sheet.pdf), of rectangular microstrip patch 246, with cut out etched strips 247 forming a crooked folded inverted conformed antenna (e.g., FICA) format, resembling a square sinus wave like path, the dimensions of which may be configured for disposing in a mobile cellular device. LFR antenna 242 includes a rectangular plate 248, optionally of silver plated copper, or of composite materials available on the market, with cut out etched strips 256 forming a planar inverted 'F' antenna (e.g., PIFA) format, resembling a rake-like toothed bar, the dimensions of which may be configured for disposing in a mobile cellular device. UFR antenna 240 and LFR antennas 242 may be disposed in parallel and separated by a dielectric material. Antenna module 120 further includes oscillation evoking antenna 208 which includes a wire, such as printed strip 251, configured for disposing in a mobile cellular device. According to a particular embodiment, antenna module 210 includes a double faced printed circuit board (PCB) 252, wherein UFR antenna 240 is imprinted on one face thereof and LFR antenna 242 is imprinted on another face thereof. According to a particular embodiment, PCB 252 includes a two ply sandwiched dielectric substrate, wherein UFR antenna 240 and LFR antenna 242 are imprinted on external faces thereof, and wherein further circuitry elements, including for example at least one coil, are imprinted on an internal face sandwiched between two plies of the dielectric substrate.

According to a particular embodiment, rake-like toothed bar LFR antenna 242 includes an array of parallel flat LFR stripes or teeth 254 of 8.5 (middle stripes) and stripes or teeth 256 of 9 mm width (peripheral strips) and spaced apart by cut out etched strips 250 at 5 mm gaps, stripes 254, 256 being perpendicularly connected at one end thereof by sheer LFR stripe or connecting bar 258 of similar width (e.g., 9 mm). The length of teeth 254, 256 may be around 39.5 mm. Variation of the dimensions may be selected to optimally meet optimal absorption within the available space in which antenna 242 is contained. Variation of teeth dimensions, spacing and multiplicity would affect the frequency range absorbed, the amount of energy captured, number of harmonics captured, etc. [i.e., longer tooth for lower frequencies/higher wavelengths, further teeth for further harmonics, larger teeth spacing (8.5 mm teeth width by 5 mm teeth spacing 256) for lower frequency ranges].

According to a particular embodiment, square sinus crooked UFR antenna 240 includes an array of parallel flat UFR stripes or long-ribs 264 of 6 mm width and spaced apart by cut out etched strips 247 at 2.5 mm gaps, each adjacent two of UFR stripes 264 being perpendicularly connected at alternating ends 268 thereof by sheer UFR stripes or short-ribs 270 of same width. The length of long ribs 264 may be around 63.5 mm and of short ribs 270 may be around 14.5 mm. Variation of the dimensions may be selected to optimally meet optimal absorption within the available space in which antenna 240 is contained. Variation of ribs dimensions, spacing and multiplicity would affect the frequency range absorbed, the amount of energy captured, number of harmonics captured, etc. i.e., longer ribs (short ribs 270) capture lower frequencies (higher wavelengths), further ribs (ribs 264) capture further harmonics, larger rib-spacing (5 mm width and 2.5 mm spacing 247) for lower frequency ranges.

Figure 6:
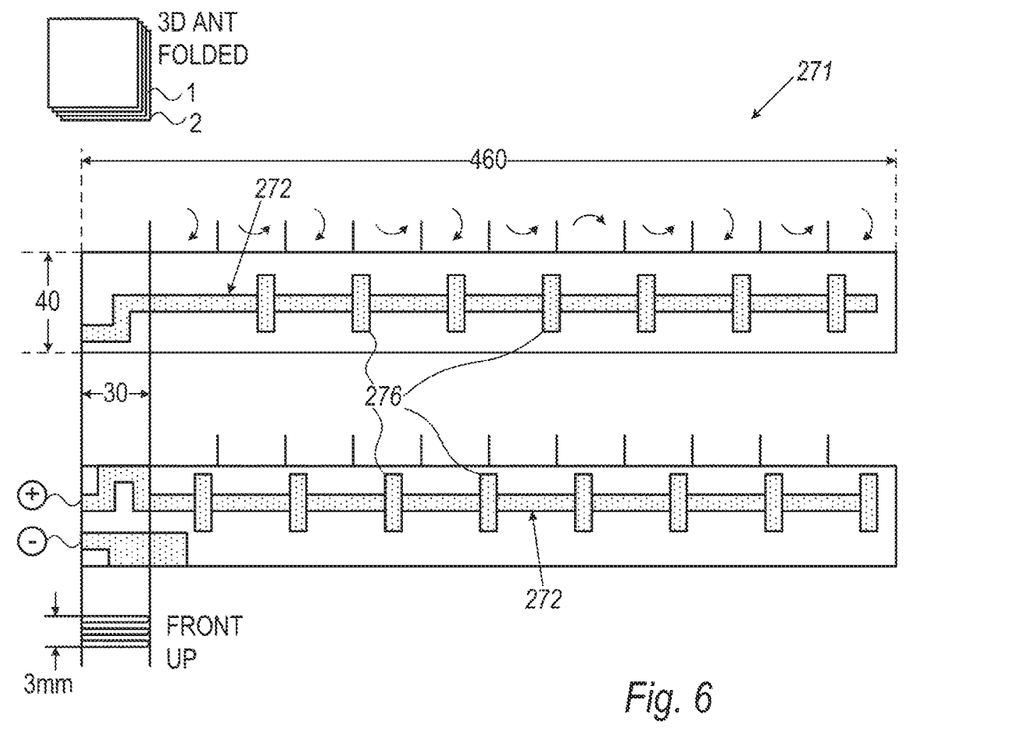
FIG. 6 illustrates two parts of an antenna, generally referenced 271, constructed and operative in accordance with the disclosed invention.
Figure 7:
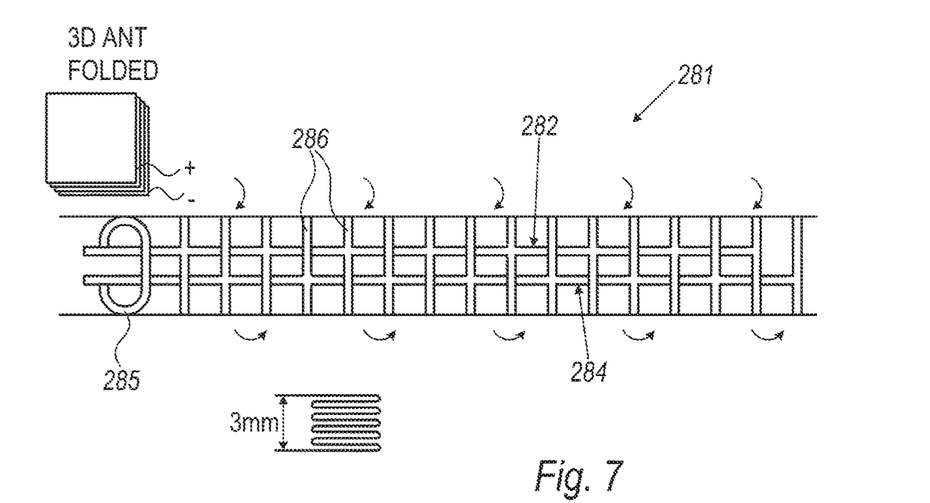
FIG. 7 illustrates an antenna resembling a structure of a Yagi-Uda ("Yagi") like antenna array, constructed and operative in accordance with the disclosed invention.
Figure 8:
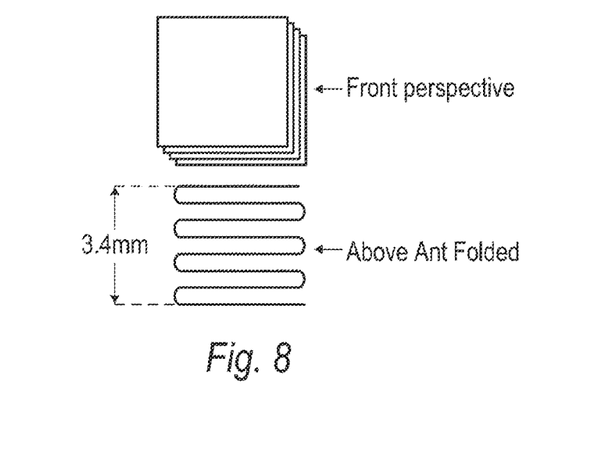
FIG. 8 illustrates a folded dipole antenna, constructed and operative in accordance with the disclosed invention.
Figure 9:
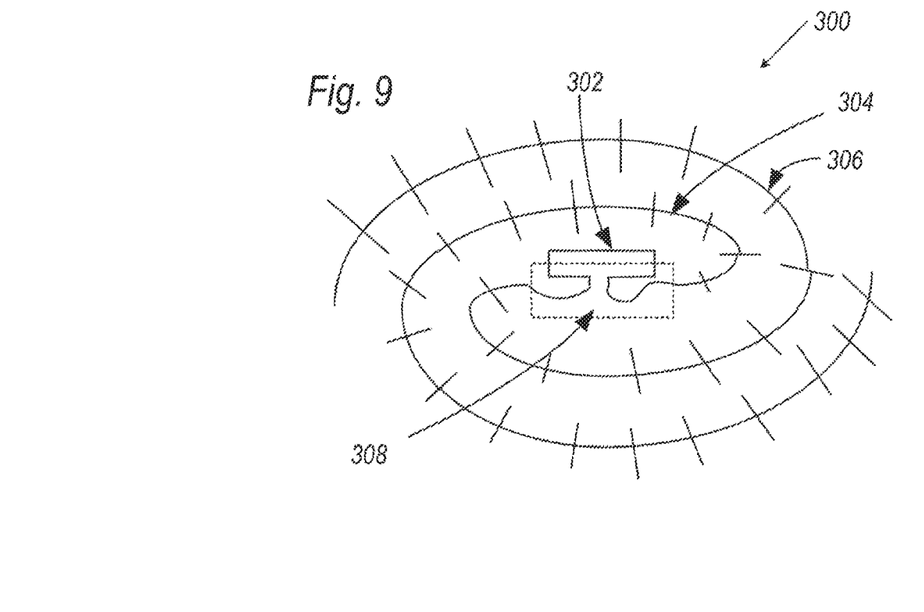
FIG. 9 illustrates a Yagi like antenna in a spiral configuration, constructed and operative in accordance with the disclosed invention.

Reference is now made to FIG. 6, FIG. 7, FIG. 8, and FIG. 9. FIG. 6 illustrates two parts of an antenna, generally referenced 271, constructed and operative in accordance with the disclosed invention. FIG. 7 illustrates an antenna resembling a structure of a Yagi-Uda ("Yagi") like antenna array, generally referenced 281, constructed and operative in accordance with the disclosed invention. FIG. 8 illustrates a folded dipole antenna, generally referenced 291, constructed and operative in accordance with the disclosed invention. FIG. 9 illustrates a Yagi like antenna in a spiral configuration, constructed and operative in accordance with the disclosed invention. Antenna 271 of FIG. 6 includes two separate ductile conducting wires 272 and 274 each with a plurality of harmonically tuned director dipole elements 276 extending from each wire. Wires 272 and 274 are connected to a loop element (not shown) and extend to an optimal conducting length for receiving ambient energy, e.g., 460 mm. Wires 272 and 274 are utilized together in absorbing RF ambient energy. Antenna 281 of FIG. 7 is a Yagi like antenna with a loop element 285 two ductile conducting wires 282 and 284 roughly parallel with harmonically tuned director dipole elements 286 alternating from each of ductile conducting wires 282 and 284. Antenna 291 of FIG. 8 is a folded loop antenna made of a single piece of malleable conducting wire 292. Wire 292 forms a rectangle with rounded edges, e.g., a rectangle which is 420 mm by 40 mm, 420 mm being the half wavelength. For simplicity, the antennas described herein are with two dimensional context, but may also be folded, rolled, or wound to form a three dimensional device. For example, Yagi like antenna 281 may be folded more than once upon itself with a multitude of folds, similar to an accordion or concertina fold. Folding of antenna 281 may result in each of elements 286 to be stacked on top of each other. Alternatively, spiraling Yagi like antenna 300 contains a loop component 302 and two wires 304 and 306, as is shown in FIG. 9. Wires 304 and 306 may intertwine (configuration similar to wires 284 and 286 of FIG. 7) in a spiraling curve together, or expand outwards concurrently (configuration similar to wires 272 of FIG. 6), about a core 308, similar to an Archimedean Spiral Antenna. Additionally, antenna 291 may be wound around axis 294 keeping antenna 291 to have a radius 296, e.g., 30 mm, forming a spiral shape. Each of the mentioned antennas, or otherwise industry standards, may be folded, wound or otherwise manipulated in any formation as needed.

Figure 10:
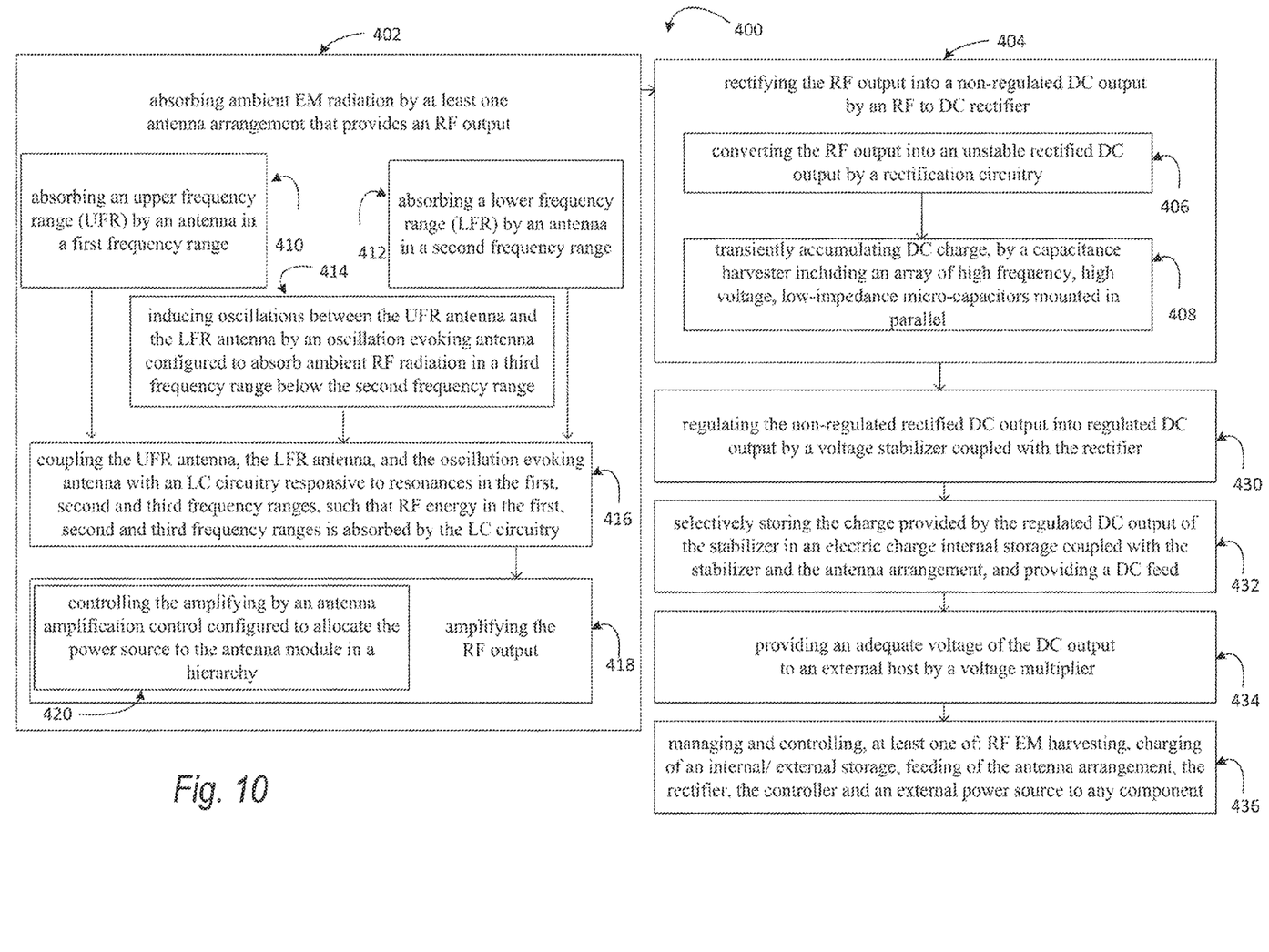
FIG. 10 is a block diagram of a method for harvesting ambient RF EM energy, operative in accordance with the disclosed invention.

Reference is now made to FIG. 10, which is a block diagram of a method 400 for harvesting ambient RF EM energy, operative in accordance with the disclosed invention Method 400 for harvesting ambient RF EM energy includes at least two principal procedures of providing an RF output by absorbing ambient EM radiation, harvesting procedure 402, and rectifying the RF output into a non-regulated DC output by an RF to DC rectifier, rectifying procedure 404. Rectifying procedure 404 optionally includes: sub-procedure 406 of converting the RF output into an unstable rectified DC output by a rectification circuitry In reference to FIG. 1 and FIG. 2, converting amplified RF 125 to a DC with rectifying circuitry 134. Rectifying procedure 404 further includes sub-procedure 408 of transiently accumulating charge with a capacitance matrix. In reference to FIG. 1 and FIG. 2, the unstable rectified DC output from the rectification circuitry is fed to an array of high frequency, high voltage, low-impedance micro-capacitors, and capacitance matrix 136, mounted in parallel. In such a parallel arrangement, the capacitors are sequentially charged in series and are discharged simultaneously as non-regulated rectified DC 138.

Harvesting procedure 402 optionally begins with sub-procedure 410, sub-procedure 412, and sub-procedure 414 simultaneously. In sub-procedure 410, an upper frequency range (UFR) of RF EM energy by is absorbed by an antenna configured to absorb ambient RF radiation in a first frequency range. In reference to FIG. 1 and FIG. 2, UFR antenna 204 absorbs ambient RF radiation in a medium frequency range of 1 GHz to 6 GHz, or a portion thereof. In sub-procedure 412, a lower frequency range (LFR) of RF EM energy is absorbed by an antenna configured to absorb ambient RF radiation in a second frequency range below the first frequency range. In reference to FIG. 2, LFR antenna 206 absorbs ambient RF radiation in a low frequency (LF) range of 40 MHz to 3 GHz, or a portion thereof. In sub-procedure 414, an oscillation evoking antenna absorbs ambient RF radiation in a third frequency range below the low frequency range by inducing oscillations between the UFR antenna and the LFR antenna. In reference to FIG. 2, oscillation evoking antenna 208 absorbs ambient RF radiation in a very low frequency (VLF) range of 50 Hz to 1.5 GHz, or a portion thereof.

In sub-procedure 416, the UFR antenna, the LFR antenna, and the oscillation evoking antenna are coupled with an LC circuitry responsive to resonances in a plurality of frequency ranges, to provide the RF output. In reference to FIG. 3, coupling UFR antenna 204, LFR antenna 206, and oscillation evoking antenna 208 with LC circuitry. LC circuitry includes inductor capacitor (LC) network 211 responsive to resonances in UFR, LFR and VLF range such that RF energy in each frequency range is absorbed by LC circuitry 211 providing RF output. Procedure 402 may further include sub-procedure 418 of amplifying the RF output by an amplifier operative for providing an amplified RF output, such as an antenna regulator operative for amplifying the RF output by a gain factor of 50 dB. In reference to FIG. 1 and FIG. 2, feeding $V_{ant}$ 119 from amplifier 112 to amplification component 202. Amplification component 202 combines $V_{ant}$ 119 with the harvested RF energy from the various antennas. Sub procedure 418 of amplifying may further include sub-procedure 420 of controlling the amplification by an antenna amplification control configured to allocate the power source to the antenna module in a hierarchy. In reference to FIG. 1 and FIG. 2, antenna control 160 controls the allocation of a power source to harvesting antenna module 120 by a hierarchy including: when external charge source 310 is available, rectified DC 142 when internal storage 170 is charged below a predetermined threshold, and DC feed $V_{bat}$ 171, when internal storage 170 is charged above a predetermined threshold.

Method 400 for harvesting ambient RF EM further includes optional procedure 430, regulating the non-regulated rectified DC output into regulated DC output by a voltage stabilizer coupled with the rectifier. In reference to FIG. 1 and FIG. 2, DC stabilizer 140 regulates non-regulated DC 138 with a voltage between 3 V to 35 V into regulated DC 142 with a constant voltage of 3.3V. Optional procedure 432, selectively storing the charge provided by the regulated DC output of the stabilizer in an electric charge internal storage coupled with the stabilizer and the antenna arrangement, and each storage mechanism able to provide a DC feed for feeding the antenna arrangement, other components involved with the RF EM harvesting, or for charging an external host storage. In reference to FIG. 1 and FIG. 2 storing regulated DC 142 in external host storage 300 or internal storage 170 and each of external 300 and internal storage 170 provides DC feeds to be used elsewhere in RF EM energy harvesting system 50. Optional procedure 434 of providing an adequate voltage of the DC output to an external host by a voltage multiplier. In reference to FIG. 1 and FIG. 2, voltage multiplier 190 adjusts regulated DC 142 into a multitude of flows with a voltage of 6.6 V.

Optional procedure 436 includes a controller managing and selects an amplification current for the harvesting antenna module from at least one of the following: the RF EM harvesting, the charging of an internal storage, the charging of an external host storage, the feeding of the antenna arrangement, the rectifier, the controller, and/or the feeding of an external power source to any component of the RF EM harvesting system when such a source is available. In reference to FIG. 1 and FIG. 2, antenna control 160 manages and selects an appropriate feed is selected to be supplemented to any element of energy harvesting system 50 from between $V_{bat}$ 171 and DC 161. Additionally, procedure 436 details the managing, controlling and allocating of a power source to an external host storage in a hierarchy. First, feeding from when external charge source 310 is available external charge source 310 is used to power all components of EM energy harvesting system 50, including an internal storage 170, as long as external host storage 300 and the internal storage 170 are not full. Next, selectively feeding non-regulated DC 138 from RF to DC rectifier 132 as needed when internal storage 170 is charged below a predetermined threshold value. Finally, selectively feeding $V_{bat}$ 171 when internal storage 170 is charged above a predetermined threshold value.

It is to be appreciated that the Detailed Description section, and not the Abstract of the Disclosure, is intended to be used to interpret the claims. The Abstract of the Disclosure may set forth one or more, but not all, exemplary embodiments of the invention, and thus, is not intended to limit the invention and the subjoined Claims in any way.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the subjoined Claims and their equivalents.

The invention claimed is:

1. Ambient radio frequency (RF) electromagnetic (EM) energy harvesting generator, comprising:

(a) an antenna arrangement for receiving RF EM radiation and providing an RF output, comprising: at least one antenna module configured to absorb ambient EM radiation for producing said RF output; and (b) an RF to DC rectifier connected to said antenna arrangement for receiving said RF output and providing a rectified DC output, said rectifier comprises:

(i) a rectification circuitry for converting said RF output into an unstable rectified DC output; and (ii) a capacitor matrix comprising an array of high frequency, high voltage, low-impedance, micro-capacitors (mounted in parallel and series) for transiently accumulating the charge received as said unstable rectified DC output of said rectification circuitry, and provide a non-regulated rectified DC output.

2. Ambient RF EM energy harvesting generator, comprising:

(a) an antenna arrangement for receiving RF EM radiation and providing an RF output, comprising: at least one antenna module configured to absorb ambient EM radiation for producing said RF output, wherein said RF EM antenna module comprises:

(i) an upper frequency range (UFR) antenna configured to absorb ambient RF radiation in a first frequency range;

(ii) a lower frequency range (LFR) antenna configured to absorb ambient RF radiation in a second frequency range at least partially below said first frequency range;

(iii) an oscillation evoking antenna for inducing oscillations between said UFR antenna and said LFR antenna, said oscillation evoking antenna being configured to absorb ambient RF radiation in a third frequency range below said second frequency range; and (iv) an LC circuitry comprising an inductor capacitor (LC) network responsive to resonances in said first, second and third frequency ranges, in which said UFR antenna, LFR antenna, and oscillation evoking antenna are connected, such that RF energy in said first, second and third frequency ranges is absorbed by said LC circuitry; and (b) an RF to DC rectifier connected to said antenna arrangement for receiving said RF output and providing a rectified DC output.

3. Ambient RF EM energy harvesting generator as in claim 2, wherein LC network comprises an inductor element and a dual capacitor arrangement comprising an upper frequency range capacitor element for inducing resonance in said first frequency range, and a lower frequency range capacitor element for inducing resonance in said second frequency range, wherein the combination of said an upper frequency range capacitor and said lower frequency range capacitor is compatible for inducing resonance in said third frequency range, all being connected in parallel, and a diode element separating one branch connecting said two capacitor elements, wherein said UFR antenna and said LFR antenna are connected to a branch of said circuitry with one of said capacitor elements connected in between, and wherein said oscillation evoking antenna is connected to said circuitry between another of said capacitor elements and said inductor element.

4. Ambient RF EM energy harvesting generator as in claim 2, wherein said first frequency range is in the UF range of 1 GHz-6 GHz, said second frequency range is in the LF range of 40 MHz-3 GHz, and said third frequency range is in the VLF range of 50 Hz-1.5 GHz.

5. Ambient RF EM energy harvesting generator as in claim 2, wherein said antenna arrangement further comprises:

(v) an amplifier connected at the output to said antenna module for amplifying said RF output and providing an amplified RF output.

6. The ambient RF EM energy harvesting generator of claim 5, wherein said amplifier comprises an antenna amplification control configured to allocate the power source to said antenna module in a hierarchy including:

(a) an external charge source when such a source is plugged into the ambient RF EM energy harvesting generator;

(b) said rectified DC output (of said rectifier) when an internal storage is charged below a predetermined threshold; and (c) said DC current feed (of an internal storage) when said internal storage is charged above a predetermined threshold.

7. The Ambient RF EM energy harvesting generator as in claim 2, wherein said antenna module further comprises:

(i) an UFR antenna comprising a plate of rectangular microstrip patch with cut out etched strips forming a crooked folded inverted conformed antenna (FICA) format, the dimensions of which are configured for disposing in a mobile cellular device;

(ii) an LFR antenna comprising a plate rectangular with cut out etched strips forming a planar inverted 'F' antenna (PIFA) format, the dimensions of which are configured for disposing in a mobile cellular device; wherein the UFR and the LFR antennas are disposed in parallel and are separated by a dielectric material; and (iii) an oscillation evoking antenna comprising a wire, configured for disposing in a mobile cellular device.

8. The active antenna module of claim 7, comprising a double faced printed circuit board (PCB), wherein said UFR antenna is imprinted on one face thereof and said LFR antenna is imprinted on another face thereof, wherein said PCB comprises a two ply sandwiched dielectric substrate, wherein said UFR and LFR antennas are imprinted on external faces thereof and wherein further circuitry elements, including at least one coil, are imprinted on an internal face sandwiched between two plies of said dielectric substrate.

9. The active antenna module of claim 8, wherein:

(1) said LFR antenna comprises an array of parallel flat LFR stripes of 8.5-9 mm width and spaced apart by said cut out etched strips at 5 mm gaps, said stripes being perpendicularly connected at one end thereof by a sheer LFR stripe of same width; and (2) said UFR antenna comprises an array of parallel flat UFR stripes of 6 mm width and spaced apart by said cut out etched strips at 2.5 mm gaps, each adjacent two of said UFR stripes being perpendicularly connected at alternating ends thereof by a sheer UFR stripe of same width.

10. Ambient RF EM energy harvesting system comprising the ambient RF EM energy harvesting generator of claim 2, further comprising, at least one of:

(c) a voltage stabilizer coupled with said rectifier for regulating said non-regulated rectified DC output into regulated DC output;

(d) an electric charge internal storage coupled with said active antenna arrangement for storing the charge provided by said generator, and for providing a DC feed, for feeding components of the system, and for charging an external host storage;

(e) a voltage regulator for regulating said a non-regulated rectified DC output of said rectification circuitry into a stabilized DC output;

(f) a voltage multiplier for providing an adequate voltage of said DC output to an external host; and (g) a controller connected to said antenna arrangement, and said rectifier, said internal storage, and other components of said system, for managing and controlling the RF EM harvesting, the charging of said internal storage, the charging of an external host storage, the feeding of DC output to said antenna arrangement, said rectifier, said controller, and other system components and the feeding of an DC input from an external power source to any component of the system, when such a source is plugged into the system.

11. The ambient RF EM energy harvesting system of claim 10, wherein said controller is operative for allocating a power source to an external host storage, and the components of the EM energy harvesting charger in a hierarchy including:

(a) when an external charge source is plugged into the EM energy harvesting charger to feed the external charge source to said external host storage and all components of the EM energy harvesting charger, including said internal EM storage, as long as said external host storage and said internal EM storage are not full;

(b) to feed said rectified DC output of said rectifier when said internal storage is charged below a predetermined threshold value; and (c) to feed said DC current feed of said internal storage when said internal storage is charged above a predetermined threshold value.

12. Ambient RF EM energy harvesting system comprising the ambient RF EM energy harvesting generator of claim 2, wherein at least one of said antennas comprises:

Yagi-Uda like antenna with director dipole elements distributed on at least one conducting material;

said Yagi-Uda like antenna manipulated in one fold;

said Yagi-Uda like antenna manipulated in multiple concertina folds;

said Yagi-Uda like antenna manipulated in multiple letter folds; and said Yagi-Uda like antenna being wound.

13. A method for harvesting ambient RF EM energy comprising the procedures of:

(a) absorbing ambient EM radiation by at least one antenna arrangement that provides an RF output; and (b) rectifying said RF output into a non-regulated DC output by an RF to DC rectifier, comprising the sub procedures of:

(i) converting said RF output into an unstable rectified DC output by a rectification circuitry; and (ii) transiently accumulating, by a capacitance matrix comprising an array of high frequency, high voltage, low-impedance micro-capacitors mounted in parallel, the charge received as said unstable rectified DC output from said rectification circuitry, wherein the capacitors are sequentially charged in series and are discharged as a non-regulated rectified DC output.

14. A method for harvesting ambient RF EM energy comprising the procedures of:

(a) absorbing ambient EM radiation by at least one antenna arrangement operative for providing an RF output, comprising the sub-procedures of:

(i) absorbing an upper frequency range (UFR) of RF EM energy by an antenna configured to absorb ambient RF radiation in a first frequency range;

(ii) absorbing a lower frequency range (LFR) of RF EM energy by an antenna configured to absorb ambient RF radiation in a second frequency range below said first frequency range;

(iii) inducing oscillations between said UFR antenna and said LFR antenna by an oscillation evoking antenna configured to absorb ambient RF radiation in a third frequency range below said second frequency range; and (iv) coupling said UFR antenna, said LFR antenna, and said oscillation evoking antenna with an LC circuitry comprising an inductor capacitor (LC) network responsive to resonances in said first, second and third frequency ranges, such that RF energy in said first, second and third frequency ranges is absorbed by said LC circuitry to provide said RF output; and (b) rectifying said RF output by a rectification circuitry operative for converting said RF output into a non-regulated rectified DC output.

15. The method for harvesting ambient RF EM as in claim 14, wherein said first frequency range is in the UF range of 1 GHz to 6 GHz, said second frequency range is in the LF range of 40 MHz to 3 GHz, and said third frequency range is in the VLF range of 50 Hz to 1.5 GHz.

16. The method for harvesting ambient RF EM as in claim 14, wherein LC network comprises an inductor element and a dual capacitor arrangement comprising an upper frequency range capacitor element for inducing resonance in said first frequency range, and a lower frequency range capacitor element for inducing resonance in said second frequency range, wherein the combination of said an upper frequency range capacitor and said lower frequency range capacitor is compatible for inducing resonance in said third frequency range, all being connected in parallel, and a diode element separating one branch connecting said two capacitor elements, wherein said UFR antenna and said LFR antenna are connected to a branch of said circuitry with one of said capacitor elements connected in between, and wherein said oscillation evoking antenna is connected to said circuitry between another of said capacitor elements and said inductor element.

17. The method for harvesting ambient RF EM as in claim 14, wherein said procedure of absorbing ambient EM radiation for providing an RF output, further comprises the sub procedure of:

(v) amplifying said RF output by an amplifier operative for providing an amplified RF output.

18. The method for harvesting ambient RF EM as in claim 17, wherein said sub procedure of amplifying further comprises controlling said amplifying by an antenna amplification control configured to allocate the power source to said antenna module in a hierarchy including:

(a) an external charge source when such a source is available;

(b) said rectified DC output of said rectifier when an internal storage is charged below a predetermined threshold; and (c) a DC feed of said internal storage, when said internal storage is charged above a predetermined threshold.

19. The method for harvesting ambient RF EM as in claim 14, further comprising, at least one of the following procedures:

(c) regulating said non-regulated rectified DC output into regulated DC output by a voltage stabilizer coupled with said rectifier;

(d) selectively storing the charge provided by said regulated DC output of said stabilizer in an electric charge internal storage coupled with said stabilizer and said antenna arrangement, and providing a DC feed for feeding said antenna arrangement, other components involved with said RF EM harvesting, and for charging an external host storage;

(e) regulating said non-regulated rectified DC output of said rectification circuitry into a stabilized DC output by a voltage regulator;

(f) providing an adequate voltage of said DC output to an external host by a voltage multiplier; and (g) managing and controlling, by a controller connected to said antenna arrangement and said rectifier, at least one of: said RF EM harvesting, the charging of an internal storage, the charging of an external host storage, the feeding of said antenna arrangement, said rectifier, and said controller, and the feeding of an external power source to any component of the RF EM harvesting system when such a source is available.

20. The method for harvesting ambient RF EM as in claim 19, wherein said procedure of managing and controlling comprises allocating a power source to an external host storage in a hierarchy including:

(a) selectively feeding, when an external charge source is available the external charge source input to an external host storage and all components of an EM energy harvesting charger, including an internal EM storage, as long as said external host storage and said internal EM storage are not full;

(b) selectively feeding said rectified DC output of said rectifier when an internal storage is charged below a predetermined threshold value; and (c) selectively feeding a DC feed of an internal storage when said internal storage is charged above a predetermined threshold value.

* * * * *